United States Patent
In't Zandt et al.

(10) Patent No.: US 7,332,398 B2
(45) Date of Patent: Feb. 19, 2008

(54) MANUFACTURE OF TRENCH-GATE SEMICONDUCTOR DEVICES

(75) Inventors: Michael A. A. In't Zandt, Veldhoven (NL); Erwin A. Hijzen, Blanden (BE)

(73) Assignee: NXP B.V., Eindhoven (NL)

( * ) Notice: Subject to any disclaimer, the term of this patent is extended or adjusted under 35 U.S.C. 154(b) by 335 days.

(21) Appl. No.: 10/538,214

(22) PCT Filed: Dec. 8, 2003

(86) PCT No.: PCT/IB03/06026

§ 371 (c)(1),
(2), (4) Date: Jun. 9, 2005

(87) PCT Pub. No.: WO2004/055884

PCT Pub. Date: Jul. 1, 2004

(65) Prior Publication Data

US 2006/0205222 A1      Sep. 14, 2006

(30) Foreign Application Priority Data

Dec. 14, 2002  (GB) .................................. 0229210.0
Oct. 15, 2003  (GB) .................................. 0324099.1

(51) Int. Cl.
*H01L 21/336*      (2006.01)

(52) U.S. Cl. ...................... 438/270; 257/328; 257/397; 257/E21.629

(58) Field of Classification Search ................ 438/268, 438/270; 257/328, 355, 395, 397
See application file for complete search history.

(56) References Cited

U.S. PATENT DOCUMENTS 5,512,517 A * 4/1996 Bryant ........................ 438/302

* cited by examiner

*Primary Examiner*—W. David Coleman
(74) *Attorney, Agent, or Firm*—Peter Zawilski

(57) ABSTRACT

A method of manufacturing a trench-gate semiconductor device (1), the method including forming trenches (20) in a semiconductor body (10) in an active transistor cell area of the device, the trenches (20) each having a trench bottom and trench sidewalls, and providing silicon oxide gate insulation (21) in the trenches such that the gate insulation (33) at the trench bottoms is thicker than the gate insulation (21) at the trench sidewalls in order to reduce the gate-drain capacitance of the device. The method includes, after forming the trenches (20), the steps of: (a) forming a silicon oxide layer (21) at the trench bottoms and trench sidewalls; (b) depositing a layer of doped polysilicon (31) adjacent the trench bottoms and trench side walls; (c) forming silicon nitride spacers (32) on the doped polysilicon (21) adjacent the trench sidewalls leaving the doped polysilicon exposed at the trench bottoms; (d) thermally oxidising the exposed doped polysilicon to grow said thicker gate insulation (33) at the trench bottoms; (e) removing the silicon nitride spacers (32); and (f) depositing gate conductive material (34) within the trenches to form a gate electrode for the device. The final thickness of the thicker gate insulation (33) at the trench bottoms is well controlled by the thickness of the layer of doped polysilicon (31) deposited in step (b). Also the doped (preferably greater than 5 e 19 cm-3) polysilicon oxidises fast at low temperatures (preferably 700-800° C.), reducing the risk of diffusing (e.g. p body) implantations present in the device at that stage.

11 Claims, 3 Drawing Sheets

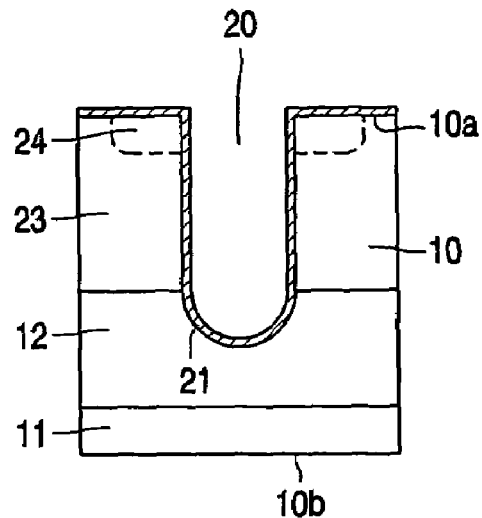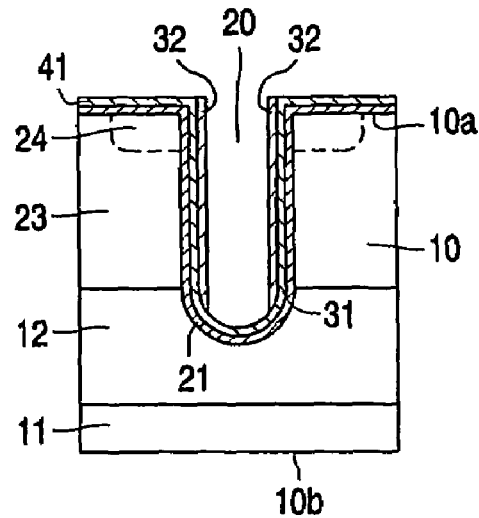
FIG. 4A              FIG. 4B
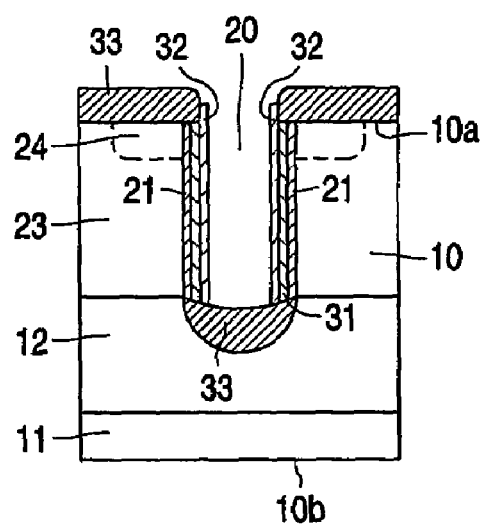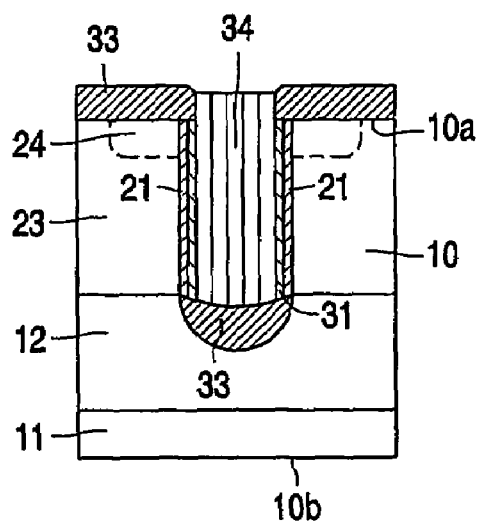
FIG. 4C              FIG. 4D

MANUFACTURE OF TRENCH-GATE SEMICONDUCTOR DEVICES

The present invention relates to methods of manufacturing trench-gate semiconductor devices.

FIG. 1 of the accompanying drawings show a schematic cross-section view of a known trench-gate form of vertical MOSFET power transistor semiconductor device. The device 1 comprises a silicon semiconductor body 10 with top and bottom major surfaces 10a, 10b, a first conductivity type drain region 11 and a first conductivity type drain drift region 12 is FIG. 1 shows the lateral extent (the cell pitch) of one complete transistor cell TC and part of an adjacent transistor cell at either side of the cell TC. Two sections are shown of a peripheral insulated gate structure G located in a trench 20 at the boundary between each two adjacent transistor cells. The trench-gate structure G extends vertically through a channel-accommodating second, opposite, conductivity, type body region 23 into the drain drift region 12, and has silicon oxide gate insulation 21A, 21B respectively at the side walls and at the bottom of the trench 20 and conductive gate material 22 in the trench 20 within the gate insulation 21A, 21B. A source region 24, of the first conductivity type, is present in each transistor cell under the top major surface 10a and adjacent the trench gate 21A, 21B, 22. Thus the source region 24 and the drain drift region 12 are vertically separated by the channel-accommodating body region 23 adjacent the side walls of the trench-gate provided by the peripheral insulated gate structure G. This enables a vertical conduction channel 23a to be formed in the body portion 23 adjacent the side wall gate insulation 21A when a suitable gate potential is applied to the gate material 22 in the on-state of the device 1, whereby current flows in a path in each transistor cell from the source region 24 vertically through the conduction channel 23a to the drain drift region 12.

An insulating region 25 is provided over the gate structure G. Source metallisation 18 contacting all of the source regions 24 is provided on the first major surface 10a over the insulating region 25 to provide a source electrode S. Although not shown, electrical connection to the insulated gate structure G is provided by extending the side wall gate insulation 21A from the trenches 20 on to the top surface 10a of the semiconductor body 10 in an inactive area outside the active transistor cell area and extending the gate material 22 on to this top surface insulating layer where it is contacted by metallisation to provide a gate electrode. A metallisation layer 19 forms an ohmic contact with the drain region 11 so as to provide a drain electrode D.

The cross-section view shown in FIG. 1 applies equally to each of two cell geometries which are known for trench-gate devices. FIG. 2 of the accompanying drawings shows a plan view of an open-cell geometry having a one-dimensionally repetitive pattern in which the trench-gates G1 are parallel stripes which each extend across the active area of the device at the peripheries of open stripe-shaped transistor cells TC1. In this case FIG. 1 shows a cross-section view along the line II-II of FIG. 2. FIG. 3 of the accompanying drawings shows a plan view of a closed-cell geometry having a two-dimensionally repetitive pattern in which the trench-gate structure G over the active area of the device surrounds closed polygonal transistor cells TC2 and comprises a trench network including segment trench regions G2S adjacent sides of the transistor cells TC2 and intersection trench regions G21 adjacent corners of the transistor cells TC2. In this case FIG. 1 shows a cross-section view along the line III-III of FIG. 3 in which the closed cells are square shaped. Another commonly used closed polygonal transistor cell is hexagonal shaped, a cross-section view of which would again be as shown in FIG. 1. FIGS. 2 and 3 show the active cell area dimensions of the transistor cells for both the open-cell and closed-cell geometries which are the trench width T, the semiconductor mesa width M between trenches and the cell pitch P which is the sum of T and M.

A desirable property for power transistors is to have good switching performance, that is fast switching and low switching losses when the device is turned on and turned off. This is particularly important where the power transistor is to be used in the output stage of a power supply, for example a voltage regulation module (VRM), where it is continuously turned on and off at very high frequency. This good switching performance depends particularly on the device having a low gate-drain capacitance. A limitation in this respect for the trench-gate device is the contribution to gate-drain capacitance added by the gate insulation at the bottom of the trench. The possibility of reducing the device gate-drain capacitance by increasing the thickness of the trench bottom insulation is known, for example from U.S. Pat. No. 4,992,390 and from WO-A-2003/043089 (our reference PHNL020937), and FIG. 1 of the accompanying drawings shows that, for this purpose, the silicon oxide gate insulation 21B at the trench bottom is thicker than the silicon oxide gate insulation 21A at the trench sidewalls.

Methods are known for manufacturing trench-gate devices as indicated above with thicker gate insulation at the trench bottoms. U.S. Pat. No. 6,291,298 proposes directional deposition of more silicon oxide at the bottom of the trench than on the sidewalls, and alternatively proposes deposition of polysilicon in the trench which is then etched back to leave a portion at the bottom of the trench which portion is then oxidised. U.S. Pat. No. 6,444,528 proposes forming a second trench at the bottom of the trench and growing selective oxide in the second trench to form the thicker bottom gate insulation. We consider that there is a need for a further, different, method for manufacturing trench-gate devices with thicker gate insulation at the trench bottoms.

According to the present invention there is provided a method of manufacturing a trench-gate silicon semiconductor device, the method including forming trenches in a semiconductor body in an active transistor cell area of the device, the trenches each having a trench bottom and trench sidewalls, and providing silicon oxide gate insulation in the trenches such that the gate insulation at the trench bottoms is thicker than the gate insulation at the trench sidewalls, wherein the method includes, after forming the trenches, the steps of:

(a) forming a silicon oxide layer at the trench bottoms and trench sidewalls;

(b) depositing a layer of doped polysilicon adjacent the trench bottoms and trench side walls;

(c) forming silicon nitride spacers on the doped polysilicon adjacent the trench sidewalls leaving the doped, polysilicon exposed at the trench bottoms;

(d) thermally oxidising the exposed doped polysilicon to grow said thicker gate insulation at the trench bottoms;

(e) removing the silicon nitride spacers; and (f) providing gate conductive material within the trenches.

In a first embodiment of the invention step (b) deposits the layer of doped polysilicon on the silicon oxide layer formed in step (a), and step (d) grows the thicker gate insulation below the nitride spacers.

A second embodiment of the invention includes the further step (g) of forming a silicon nitride layer at the trench bottoms and trench sidewalls on the silicon oxide layer which has been formed in step (a), wherein step (b) deposits the layer of doped polysilicon on the silicon nitride layer formed in step (g) such that the silicon nitride layer at the trench bottoms limits the downward growth of the thicker gate insulation in step (d), and wherein the silicon nitride layer is removed from the trench sidewalls before depositing gate conductive material in step (f).

One important advantage of the method of the present invention is that the final thickness of the thicker silicon oxide gate insulation at the trench bottoms is well controlled by the thickness of the layer of doped polysilicon deposited in step (b), and then exposed in step (c) taking into account the oxidation time and temperature in step (d). In the first embodiment the oxidation process can be controlled so that after the bottom exposed doped polysilicon has been oxidised then only a small amount of the silicon under the trench bottom is oxidised. In the second embodiment the downward oxidation growth of the thicker gate insulation is completely controlled by the silicon nitride layer at the trench bottom. In comparison with the method according to the present invention, the prior art proposal for directional deposition of silicon oxide at the bottom of the trench is difficult to achieve as well as to control, in the prior art proposal to deposit polysilicon and then etch it back before oxidation it is difficult to control the etch back to produce a required thickness, and the prior art proposal to form a second trench in which the thicker bottom gate insulation is formed is a complex method.

Another important advantage of the method of the present invention lies in the use of doped polysilicon rather than undoped polysilicon for the layer which is deposited in step (b) and then thermally oxidised in step (d). Doped polysilicon oxidises faster than undoped silicon and therefore lower temperatures and shorter oxidation times can be used which reduces the thermal budget of the process and lessens the risk of this oxidation causing unwanted diffusion of the substrate doping of the device and also unwanted diffusion of implantations which may be present in the device at that stage such as the channel accommodating body region (23 as shown in FIG. 1). In particular, highly doped polysilicon oxidises much faster than undoped polysilicon at low temperatures.

In the method of present invention the doped polysilicon deposited in step (b) is preferably greater than 5 e 19 cm-3 As or P doped polysilicon, and furthermore in step (d) the doped polysilicon is thermally oxidised preferably at a temperature in the range 650-850° C., in particular 700-800° C. For polysilicon doped to this level the oxidation time can be reduced by a factor of 10 at these low temperatures compared with the oxidation time for undoped polysilicon.

According to the present invention there is also provided a trench-gate semiconductor device manufactured by the method as specified above.

An embodiment of a device in accordance with the present invention may be defined as a trench MOSFET comprising:

a drain region of first conductivity type;

a body region over the drain region;

a trench extending from a first major surface through the body region;

source regions laterally adjacent to the trench at the first major surface;

thermal gate oxide on the side walls of the trench;

a gate electrode in the trench insulated from the body region by the gate oxide;

and a thick oxide plug formed of oxidised doped polysilicon at the base of the trench extending into the drain region.

As explained above, the present invention is primarily directed to reducing the contribution to gate-drain capacitance added by the gate insulation at the bottom of the trench in a trench-gate device, particularly bearing in mind the desirable property of good switching performance for power transistors. Another desirable property for power transistors is to have a low specific on-state resistance. For low and medium voltage power transistors, that is with a drain-source breakdown reverse voltage of up to respectively about 50 volts and about 200 volts, the specific on-state resistance of the device is to a large extent dependent on the sum total of the conducting channel peripheries. Thus for a given size of the device, that is a given active transistor cell area, a larger number of transistor cells in that active area leads to a lower specific on-state resistance. For a given size of device a trench-gate structure vertical MOSFET device can have more transistor cells and a lower specific on-state resistance than a double diffused planar gate vertical MOSFET device (VDMOS).

For low and medium voltage trench-gate vertical power transistors, both open cell type and closed cell type, the number of cells in the active device area is made larger primarily by decreasing the cell pitch (P as shown in FIGS. 2 and 3). A disadvantage of doing this is that the amount of trenches in a given area increases and thus the gate-drain capacitance increases since this is partly determined by the trench bottom area. This disadvantage becomes particularly important for currently proposed devices in which the cell pitch is less than 2 micron, for example 1 micron, and it is difficult to achieve the target low gate-drain capacitance for these devices. The reduction of gate-drain capacitance by providing thicker gate insulation at the trench bottoms using the method of the present invention is therefore particularly advantageous for devices having the currently proposed small cell pitch as just mentioned.

In the case where a vertical power transistor manufactured by the method of the present invention is a closed cell device, it may be defined as having a trench network which includes segment trench regions adjacent sides of the transistor cells, wherein said trenches in which the gate insulation is thicker at said trench bottoms than the gate insulation at said trench sidewalls comprise the segment trench regions. Referring back to FIG. 3 of the accompanying drawings which shows the just specified segment trench regions G2S and intersection trench regions G2I adjacent corners of the cells it will be appreciated that, for a given thickness, gate insulation at the bottom of the segment trench regions contributes more to the gate-drain capacitance of the device than gate insulation at the bottom of the intersection trench regions. Thus in the device as just defined the trenches in which the gate insulation is thicker at said trench bottoms includes the segment trench regions, and these trenches optionally may also include the intersection trench regions.

The above-defined first and second embodiments of the method of the present invention will now be described in detail with reference to the accompanying drawings, in which:

FIG. 4A to 4D show steps in a method of manufacturing a trench-gate semiconductor device according to a first embodiment of the present invention.

FIGS. 4A to 4D show steps in a method of manufacturing a trench-gate semiconductor device according to a first embodiment of the present invention.

Figure 1:
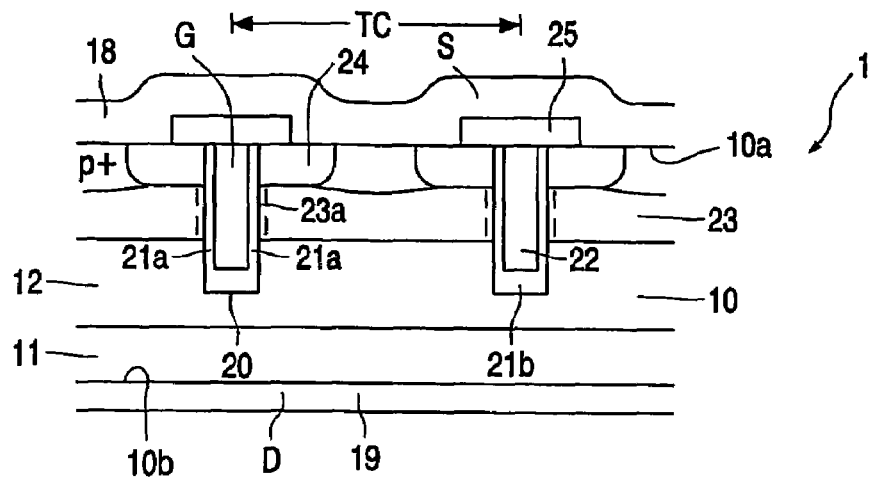
FIG. 1 shows a schematic cross-section view of a known trench-gate MOSFET as has been described above.
Figure 2:
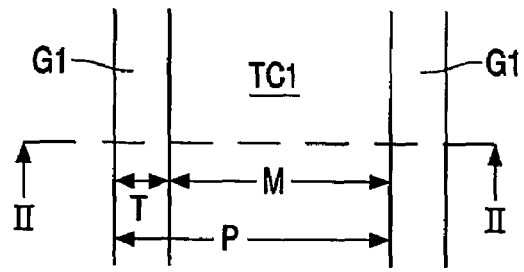
FIG. 2 shows a plan view of an open cell geometry with the line II-II indicating the cross-section of FIG. 1.

Referring now to FIG. 4A, a monocrystalline silicon semiconductor body 10 with top and bottom major surfaces 10a and 10b is formed with an n+ type drain region substrate 11 on which is grown an epitaxial n type drain drift region 12. A p type channel-accommodating body region 23 may then formed by implantation and diffusion into the drain drift region 12 or by epitaxial growth on top of the drift region 12. N+ type regions providing source regions 24 for transistor cells to the sides of trenches 20 are preferably implanted after the process steps shown in FIGS. 4A to 4D and are therefore shown with dotted lines. The regions and their reference signs just referred to correspond to the referenced regions of the known device already shown in and described with reference to FIG. 1. Trenches 20, one of which is shown in FIG. 4A, are then etched from the top major surface 10a through the p body region 23 and into the drain drift region 12. A layer of silicon dioxide 21 is then deposited or grown, preferably grown, on the top surface 10a and on the side walls and bottom of each trench 20.

Referring now to FIG. 4B, a layer 31 of doped polysilicon is then deposited on top of the silicon body and adjacent the trench bottoms and sidewalls, that is in this embodiment directly on to the silicon oxide layer 21. The polysilicon layer 31 is preferably highly doped, that is greater than 5 e 19 cm-3, e.g. 1 e 20 cm-3, As or P doped. The thickness of the doped polysilicon layer 31 is chosen to provide an oxidised layer, as will be described with reference to FIG. 4C, of approximately double thickness and is initially for example 100 nm. A relatively thin, e.g. 20 nm, layer of silicon nitride is then deposited and anisotropically etched to form silicon nitride spacers 32 on the doped polysilicon 31 adjacent the trench sidewalls leaving the doped polysilicon exposed at the trench bottoms.

Referring now to FIG. 4C, the exposed doped polysilicon is then thermally oxidised to grow thicker silicon dioxide 33 at the top of the body 10 and, as gate-drain insulation, at the trench bottoms below the nitride spacers 32. During this step, the nitride spacers 32 protect the polysilicon layer 31 and the silicon dioxide layer 21 at the side walls of the trenches from oxidation and thickening. This step of thermal oxidation is preferably a wet oxidation at a temperature in the range 650-850° C., preferably 700-800° C.

The final thickness, for example 200 nm, of the thicker silicon dioxide insulation 33 at the trench bottoms is well controlled by the thickness of the initial layer 31 of doped polysilicon deposited and then exposed as described with reference to FIG. 4B taking into account the oxidation time and temperature. The oxidation process can be controlled so that after the bottom exposed doped polysilicon has been oxidised then only a small amount of the silicon under the trench bottom is oxidised. For polysilicon doped to the level indicated, the oxidation time at the temperatures indicated may be reduced by a factor of 10 compared with the oxidation time which would be required for undoped silicon. This reduction in the thermal budget lessens the risk of this oxidation causing unwanted diffusion of the substrate 12 doping and also unwanted diffusion of the p body 23 (if already implanted) present in the device at that stage.

Referring now to FIG. 4D, the nitride spacers 32 are then removed, for example with a wet etch, and then the trenches are filled with deposited or grown gate conductive material 34, for example doped polysilicon. The thicker gate insulation 33 at the trench bottoms provides the thicker gate insulation 21B as shown in FIG. 1, and the silicon dioxide 21 initially grown as described with reference to FIG. 4A is retained as the trench side wall gate insulation 21A as shown in FIG. 1. The doped polysilicon layer 31 at the sidewalls of the trenches which was protected from oxidation by the nitride spacers 32 can be left so as to form, together with the conductive material 34, a gate electrode for the device. In an alternative method, the silicon dioxide 21 at the trench side walls as shown in FIG. 4D can be a sacrificial oxide which, after removal of the layer 31 from the trench sidewalls, is removed with a wet etch which will leave most of the thicker silicon oxide gate insulation 33 at the trench bottoms, and then silicon oxide gate insulation can be grown at the trench side walls. This alternative needs more process steps, and so is not preferred. The oxide 33 on the top surface 10a of the device is removed or etched back later in the process of making the device which includes providing, as shown in FIG. 1, the insulating region 25 over the gate conductive material 34 (22 as shown in FIG. 1), the source region 24 implantation and diffusion (preceded by the p body 23 implantation and diffusion if the p body has not previously been implanted), the source metallisation 18, a gate connection and the drain metallisation 19.

FIGS. 5A to 5D show steps in a method of manufacturing a trench-gate semiconductor device according to a second embodiment of the present invention.

Figure 3:
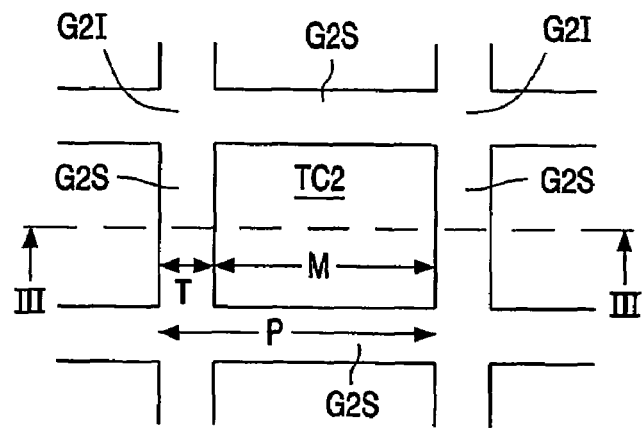
FIG. 3 shows a plan view of a closed square cell geometry with the line III-III indicating the cross-section of FIG. 1.
Figure 5A:
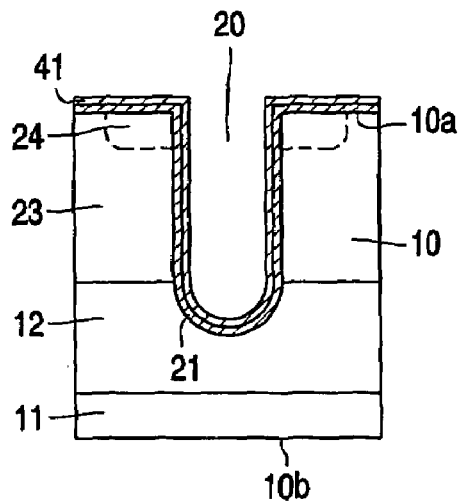
FIGS. 5A to 5D show steps in a method of manufacturing a trench-gate semiconductor device according to a second embodiment of the present invention.

Referring now to FIG. 5A, a silicon semiconductor body 10 with a drain region substrate 11, a drain drift region 12, a p body region 23, a trench 20 and a layer of silicon dioxide 21 is formed in the same manner as has been described above with reference to FIG. 3A. A silicon nitride layer 41 is also formed at the trench bottoms, the trench side walls and the top of the body 10 on the silicon oxide layer 21.

Figure 5B:
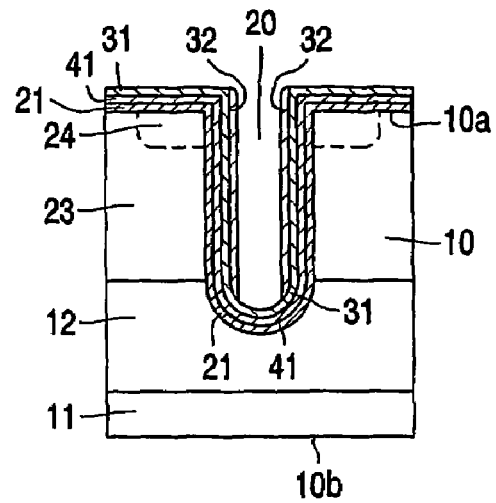

Referring now to FIG. 5B, a layer of doped polysilicon 31 and nitride spacers 32 are formed in the same manner as has been described above with reference to FIG. 4B but in this case on the nitride layer 41. The doped polysilicon layer 31 is exposed at the trench bottom, but with the nitride layer 41 between the exposed doped polysilicon layer 31 and the silicon dioxide layer 21 at the trench bottom.

Figure 5C:
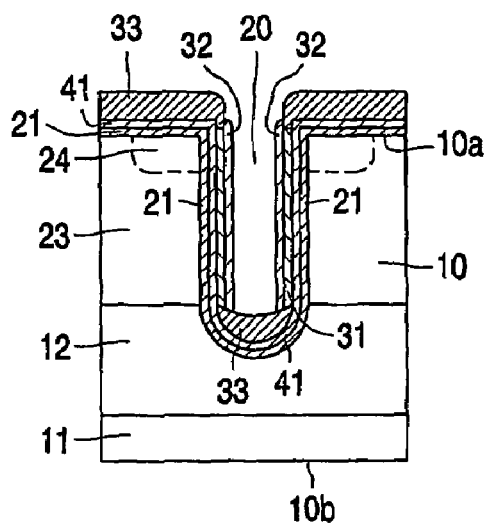

Referring now to FIG. 5C, the exposed doped polysilicon layer 31 is thermally oxidised in the same manner as has been described above with reference to FIG. 4C but in this case the silicon nitride layer 41 at the trench bottoms limits the downward growth of the thicker silicon dioxide gate insulation 33 at the trench bottoms.

Figure 5D:
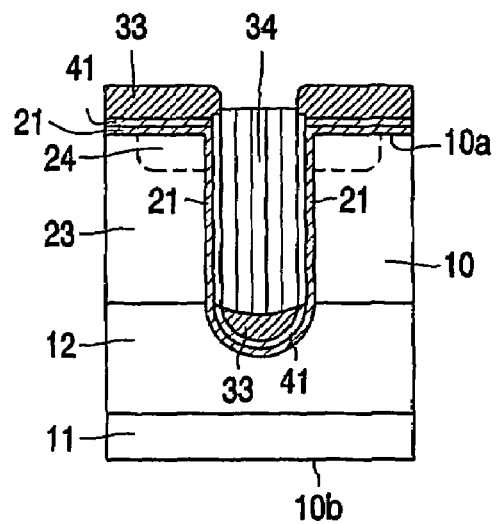

Referring now to FIG. 5D, the silicon nitride spacers 32, the doped polysilicon layer 31 and the silicon nitride layer 41 at the sidewalls of the trenches are removed. The silicon dioxide 21 may be retained as the trench sidewall gate insulation, as is shown in FIG. 5D, or it may be a sacrificial oxide which is removed before growing silicon oxide gate insulation at the trench sidewalls. The trenches are then filled with deposited or grown gate conductive material 34 to form a gate electrode for the device. In this case the silicon nitride layer 41 will be left in the bottom of the trenches and on top of the body 10. This will not do any harm to the device performance.

From reading the present disclosure, other variations and modifications will be apparent to persons skilled in the art. Such variations and modifications may involve equivalent and other features which are already known in the art, and which may be used instead of or in addition to features already described herein.

Although Claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any Claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The Applicants hereby give notice that new Claims may be formulated to such features and/or combinations of such features during the prosecution of the present Application or of any further Application derived therefrom.

The invention claimed is:

1. A method of manufacturing a trench-gate silicon semiconductor device, the method including forming trenches in a semiconductor body in an active transistor cell area of the device, the trenches each having a trench bottom and trench sidewalls, and providing silicon oxide gate insulation in the trenches such that the gate insulation at the trench bottoms is thicker than the gate insulation at the trench sidewalls, wherein the method includes, after forming the trenches the steps of:

forming a silicon oxide layer at the trench bottoms and trench sidewalls;
    depositing a layer of doped polysilicon adjacent the trench bottoms and trench side walls;
    forming silicon nitride spacers on the doped polysilicon adjacent the trench sidewalls leaving the doped polysilicon exposed at the trench bottoms;
    thermally oxidising the exposed doped polysilicon to grow said thicker gate insulation at the trench bottoms;
    removing the silicon nitride spacers; and
    providing gate conductive material within the trenches.

2. The method as recited in claim 1,
    wherein step (b) deposits the layer of doped polysilicon on the silicon oxide layer formed in step (a), and
    wherein step (d) grows the thicker gate insulation below the nitride spacers.

3. The method as recited in claim 1, including
    the further step (g) of forming a silicon nitride layer at the trench bottoms and trench sidewalls on the silicon oxide layer which has been formed in step (a),
    wherein step (b) deposits the layer of doped polysilicon on the silicon nitride layer (41) formed in step (g) such that the silicon nitride layer at the trench bottoms limits the downward growth of the thicker gate insulation in step (d), and
    wherein the silicon nitride layer is removed from the trench sidewalls before depositing gate conductive material in step (f).

4. The method as recited in claim 1,
    wherein the silicon oxide layer formed at the trench sidewalls in step (a) is retained as trench sidewall gate insulation before depositing gate conductive material in step (f).

5. The method as recited in claim 1, wherein the doped polysilicon deposited in step (b) is greater than $5 \times 10^{19}$ cm$^{-3}$ As-doped or P-doped polysilicon.

6. The method as recited in claim 1, wherein in step (d) the doped polysilicon is thermally oxidised at a temperature in the range 650-850° C.

7. A trench-gate silicon semiconductor device manufactured by the method as recited in claim 1.

8. The method as recited in claim 6, wherein the oxidation temperature range is 700-800° C.

9. The device as recited in claim 7, wherein the device is a vertical power transistor.

10. The device as recited in claim 9, wherein the transistor cells have a cell pitch less than 2 micron.

11. The device as recited in claim 9,
    wherein the device has a plurality of electrically parallel closed transistor cells configured in a two-dimensionally repetitive pattern in the active area of the device,
    wherein a trench network includes segment trench regions adjacent sides of the transistor cells, and wherein said trenches in which the gate insulation is thicker at said trench bottoms than the gate insulation at said trench sidewalls comprise the segment trench regions.

* * * * *